United States Patent [19]

Climent et al.

[11] Patent Number: 4,748,416

[45] Date of Patent: May 31, 1988

[54] GENERATOR OF STRONG SYNCHRONOUS CURRENT PULSES ON PARALLEL OUTPUTS

[75] Inventors: Jean-Pierre Climent, Saint Germain Les Corbeil; Jean-Claude Tronel, Bretigny-sur-Orge; Adoplhe Yastroubinski, Pessac, all of France

[73] Assignee: Commissariat a l'Energie Atomique, Paris, France

[21] Appl. No.: 813,609

[22] Filed: Dec. 26, 1985

[30] Foreign Application Priority Data

Dec. 26, 1984 [FR] France .............................. 8419807

[51] Int. Cl.⁴ ............................................ H03K 3/537
[52] U.S. Cl. ........................................ 328/62; 328/67
[58] Field of Search .................. 328/62, 65, 66, 67, 328/70, 76, 78, 79, 88, 105

[56] References Cited

U.S. PATENT DOCUMENTS 3,214,707 10/1965 Wuerker ................................ 328/67
3,353,064 11/1967 Kitchen et al. ........................ 328/67
4,272,692 6/1981 Morse ..................................... 328/67

FOREIGN PATENT DOCUMENTS 0573856 9/1977 U.S.S.R. ................................ 328/65

Primary Examiner—John Zazworsky
Attorney, Agent, or Firm—Cesari and McKenna

[57] ABSTRACT

A generator for producing strong synchronous current pulses on parallel outputs comprises a high voltage stage, a group of N identical modules and a triggering control means. Each module comprises a storage capacitor charged by the high voltage stage and the triggering control means controls the modules, so that they emit synchronous current pulses. Application to the simulation of strong current pulses injected into a polyphase electrical mains by powerful electromagnetic disturbances and interferences, such as lightning.

1 Claim, 3 Drawing Sheets

GENERATOR OF STRONG SYNCHRONOUS CURRENT PULSES ON PARALLEL OUTPUTS

BACKGROUND OF THE INVENTION

The present invention relates to a generator of strong synchronous current pulse on parallel outputs. The term strong current pulses is understood to mean a pulse, whose intensity is approximately 10 kiloamperes and whose half-intensity width is a few microseconds. Such a current pulse supplied on an electric line makes it possible to simulate the injection of a current pulse due to a strong electromagnetic pulse. The generator according to the invention supplying synchronous current pulses on several parallel outputs, more particularly, makes it possible to test electrical devices connected to a polyphase mains, e.g. a low voltage three-phase mains.

In the case of a low voltage mains, the electromagnetic pulse injecting a parasitic current pulse in common mode into said mains can be represented by an equivalent Norton generator with the following characteristics:

short-circuit current: I=30 kA
half-intensity width: $t_h=2$ $\mu s$

A current generator with a single output having these characteristics is known, but said generator suffers from several disadvantages. It must in particular be equipped with protective shielding to absorb the radiation due to the very high voltage from a source supplying, e.g. 300 kV. As a result of the shielding the generator has a considerable weight and size making it difficult to transport. Thus, the electrical equipments which it is wished to test must be moved from this place of installation to the laboratory where the generator is located. Moreover, the known generator is complex and therefore costly.

Research has been carried out on the effect of the shape of the current pulse on the behavior of an electrical apparatus receiving said pulse. This research has been carried out, more particularly, in the case where the apparatus to be tested is a protective system located between a low voltage mains and electrical equipment to be protected.

Such a protective system is described in French patent application No. 84 06062, filed on Apr. 17 1984. It essentially comprises a clipper, whose function is to tap off most of the energy of the pulse of the mains line and a low-pass filter, whose function is to attenuate the intensity of the disturbance in the high frequency range.

The behavior of such a protective system in the presence of a current pulse produced by an intense electromagnetic pulse is essentially a function of two parameters of the said pulse, which are, on the one hand, its slope in both voltage and current and, on the other, its half-intensity width.

The slope of the pulse conditions the dynamic response of the clipper. The voltage slope determines the dynamic breakdown voltage of the clipper and the intensity slope determines the voltage developed at the terminals of the circuit. With regards to the half-intensity width of the injected current pulse, its frequency spectrum influences the response of the low-pass filter.

A current pulse generator is known, which supplies a current pulse, whose slope and half-intensity width are representative of a strong electromagnetic pulse. This generator is simpler than the preceding generator, because all the parameters of the current pulse are not reproduced. However, it requires a 100 kV voltage source for producing the current pulse. Thus, like the preceding generator, it requires protective shielding against the radiation of said voltage source.

Moreover, the two known generators described above also suffer from an important disadvantage for the common mode test on polyphase mains. More particularly, these generators have a single output. Consequently, for use on a polyphase mains, they must be equipped with a capacitive decoupling system in order that the pulse produced is distributed over each phase of the mains in question.

SUMMARY OF THE INVENTION

The invention aims at obviating the disadvantages of the known generators. It aims more particularly at reducing the dimensions, weight and cost of a generator of strong current pulses. It relates to a current pulse generator in which the voltage source is weaker than in the known generators, which makes it possible to eliminate the protective shielding. Moreover, the generator according to the invention has a plurality of modules, each of which is able to supply the same current pulse. These modules are simultaneously controlled, so that a plurality of synchronous current pulses can be applied to a polyphase mains.

More specifically, the invention relates to a generator of strong synchronous current pulses on parallel outputs incorporating a high voltage stage, a plurality of identical modules N, in which N is an integer, and a triggering control means. Each module is provided with an input terminal, an output terminal and a triggering control terminal and more particularly it has a storage capacitor. Each storage capacitor is charged by the high voltage stage. Their simultaneous discharge, controlled by the triggering control means, produces synchronous current pulses on the output terminal of each module.

According to a preferred embodiment, each module comprises a spark gap between the storage capacitor and the output terminal, as well as means for controlling the clipper controlled by the triggering control means.

According to another feature of the invention, the control means of the spark gap of each module is a transformer.

In preferred manner, the triggering control means comprises a triggering device and a control circuit, the triggering device has two spark gaps in cascade supplied by the high voltage stage and controlled by said control circuit.

According to another feature of the invention, in the case where the generator supplies current pulses on an a.c. mains of the monophase or polyphase type, the control circuit activates the triggering device at an instant determined as a function of the phase of a signal on said mains.

BRIEF DESCRIPTION OF THE DRAWINGS

The invention is described in greater detail hereinafter relative to non-limitative embodiments and the attached drawings, wherein show.

DETAILED DESCRIPTION OF THE PREFERRED EMBODIMENT

Figure 1:
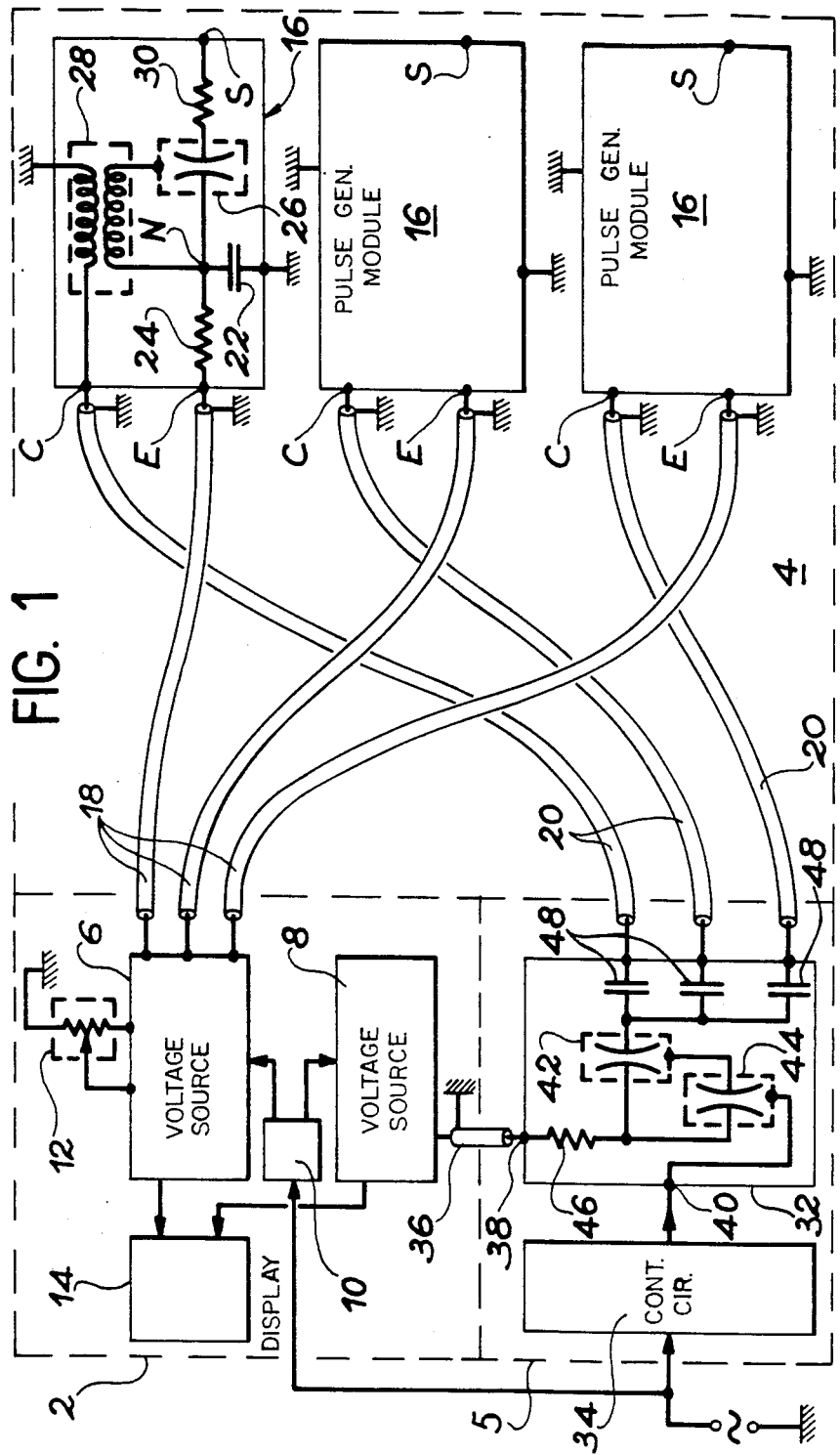
FIG. 1., diagrammatically, the current pulse generator according to the invention, which has three modules for injecting three synchronous current pulses into a three-phase mains.

FIG. 1 diagrammatically shows an embodiment of the current pulse generator according to the invention, which comprises three components, namely a high voltage stage 2, a group of modules 4, each supplied by the high voltage stage 2 and supplying a current pulse, and a control means 5 for controlling the synchronous emission of current pulses by each module.

The high voltage stage 2 essentially comprises a first high d.c. voltage source 6 and a second high d.c. voltage source 8, which are, in each case, supplied by a power supply unit 10, which e.g. is connected to the a.c. low voltage mains.

The first source 6 supplies a plurality of identical voltage signals intended for each module of module group 4. The intensity of these voltage signals can be regulated, via a means 12, by the operator. The chosen voltage level defines the current intensity of the pulse supplied by each module. The voltages supplied by said first high voltage source 6 are e.g. between 0 and 15 kV.

The voltage signal provided by the second high voltage source 8 supplies the control means 6. For example, this voltage is between 0 and 7.5 kV and can be adjusted by a means within source 8. The voltage levels supplied by the first source 6 and the second source 8 are displayed on a visual display means 14.

In the embodiment shown in FIG. 1, group 4 comprises 3 identical modules 16. It is obvious that this number is given merely for illustration purposes and that the generator according to the invention can have a random number of modules. The particular case of a generator with three modules is of interest in practice, because it makes it possible to test electrical equipment connected to the three-phase mains.

Each module 16 has an input terminal E, an output terminal S and a control terminal C. The input terminal is connected to one of the outputs of the first high voltage source 6 by a coaxial connection 18. In the same way, the control terminal of each module 16 is connected to control means 5 by a coaxial connection 20.

Each module 16 supplies to its output terminal S a strong current pulse upon receiving a control signal emitted by the control means 5. The current pulses supplied by the module are synchronous.

Each module 16 comprises three components, namely an energy storage means for storing the energy received from the high voltage source 6, a switch located between said storage means and the output terminal S and a means for controlling the opening of said switch.

In the diagrammatic drawing of FIG. 1, the storage means is constituted by a capacitor 22 with which is associated a load impedance 24. Capacitor 22 is connected, on the one hand, to an electrical node N and, on the other hand, to earth. Load impedance 24 is connected to input terminal E and to electrical node N.

The switch is a spark gap 26 positioned between electrical node N and output terminal S. The signal controlling the state of the switch, which signal is emitted by control means 5 on coaxial connection 20, is transmitted to the switch via a transformer 28. The terminals of the primary circuit of said transformer are respectively connected to control terminal C and to earth. The terminals of the secondary circuit are connected to the electrical node N and to the switch control input. Each module can also have an impedance matching resistor 30 between the switch and the output terminal S.

A special embodiment of a module 16 will be described with reference to FIG. 2.

A description will now be given of the generator control means 6 of FIG. 1. This control means comprises a triggering device 32 and a control circuit 34 for the latter. Triggering device 32 is supplied by the second high voltage source 8 via a coaxial connection 36. It is provided with three outputs for supplying an identical control signal to the control terminal C of module 16 by coaxial connections 20. It finally has a control input 40 for receiving a signal controlling the triggering of control circuit 34.

In the embodiment shown in FIG. 1, triggering device 32 comprises two spark gaps 42, 44, a load impedance 46 and three insulating capacitors 48. The two spark gaps 42, 44 are in cascade and their inputs are connected to the supply input 38 by load impedance 46. The output of spark gap 42 is connected to one of the terminals of each of the capacitors 48, whereof the other terminal of which is connected to the coaxial connection 20. The control electrode of spark gap 42 is connected to the output of spark gap 44, whose control electrode is controlled by the triggering control circuit 34. For example, triggers 42, 44 can respectively be of Edgerton types GP91 and KN6B.

The triggering control circuit 34 defines the output time of the current pulses from the modules. Circuit 34 is particularly advantageous in the case where the current pulses supplied by the generator according to the invention are injected into an a.c. mains. In this case, if circuit 34 receives said a.c. signal, or one of the phases of said signal as shown in FIG. 1, said circuit can control the emission time of the current pulses from the generator as a function of the phase of said alternating signal.

This is of interest, because the response of an electrical apparatus or a protective system connected to the a.c. mains subjected to a current pulse injected by an electromagnetic pulse can vary as a function of the appearance time of said current pulse with respect to the phase of the signal on the mains. The triggering control circuit 34 makes it possible to accurately and reproducibly define the emission time of the current pulses in the mains. This, in turn, makes it possible to test very completely an electrical apparatus subjected too a strong current pulse.

Figure 2:
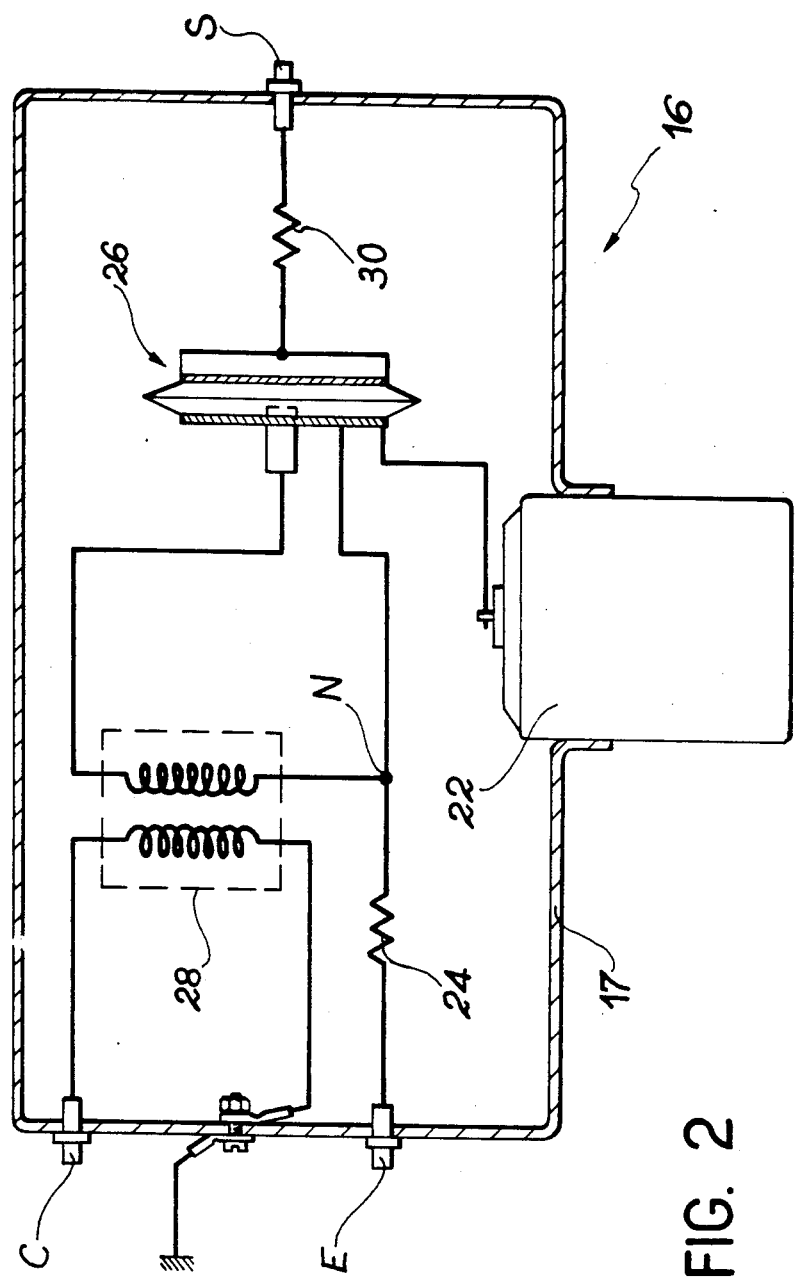
FIG. 2 an embodiment of one of the modules of the generator of FIG. 1.

With reference to FIG. 2, a description will now be given of a special embodiment of a module 16. In FIG. 2, the references identical to those of FIG. 1 designate the same elements.

The elements of the module 16 are placed in a metal enclosure 17 connected to earth. Control terminal C, input terminal E and output terminal S are e.g. realized by a BNC plug traversing said enclosure. The energy storage capacitor 22 is e.g. of the Maxwell type. It capacitance is 3 $\mu$F. The load impedance 24 associated with said capacitor has a value of a few kiloohms. The spark gap 26 is e.g. of Thomson type TH9076 and transformer 28 is a conventional insulating transformer.

Resistor 30 constitutes an impedance matching means and makes it possible to bring the impedance constituted by the apparatus to be tested and said resistor 30 to a desired value as a function of the level of the high voltage received by the input terminal E of module 16. For example, if it is wished that the current pulse supplied on output terminal S have an intensity of 10 kA, whereas the voltage received on the input terminal E is 10 kV, resistor 30 must be such that the impedance from the output of spark gap 26 is 1 ohm.

If the apparatus to be tested is a protective system having a spark gap and a filter as indicated hereinbefore, its impedance is a few tenths of an ohm. Resistor 30 then also has a value of a few tenths of an ohm.

The impedance matching resistor 30 is shown in FIG. 2 within enclosure 17. However, it could also be located in an insulated enclosure connected to the output terminal S of enclosure 17. The latter option is preferable when the generator is used for testing the behavior of different electrical equipments not requiring the same impedance matching resistance.

Thus, the general electrical characteristics of a module 16 are as follows:
 resistance: a few tenths of an ohm
 inductance: a few tenths of a microhenry
 capacitance: a few microfarads The Applicant has produced a current pulse generator with three modules like that shown in FIG. 2. The characteristics of this generator are as follows:
 charging voltage of the modules: 10 kV
 resistance (resistor 30+input resistance of the apparatus to be tested): 1 ohm
 capacitance: 3 $\mu$F
 inductance: 0.5 $\mu$H.

For each module, the generator supplies a current pulse of intensity 10 kA having a half-intensity width of 2 $\mu$s. This pulse realizes a good simulation of a pulse injected by a strong electromagnetic pulse. It should be noted that if all the parameters of a current pulse produced by an electromagnetic pulse are not satisfactory (e.g. the voltage level is 10 kV instead of 300 kV), the characteristic parameters of the pulse determining the behavior of the apparatus to be tested are reproduced by the generator according to the invention.

The Applicant has used this current generator for testing a protective system constituted by a clipper followed by a low-pass filter. The clipper, of the lightning arrester type, is constituted by spark gap and a varistor.

The low-pass filter is a LC filter, which can be of type $\pi$ or preferably of type L. A complementary inductance can be placed between the spark gap and the low-pass filter.

Figure 3A:
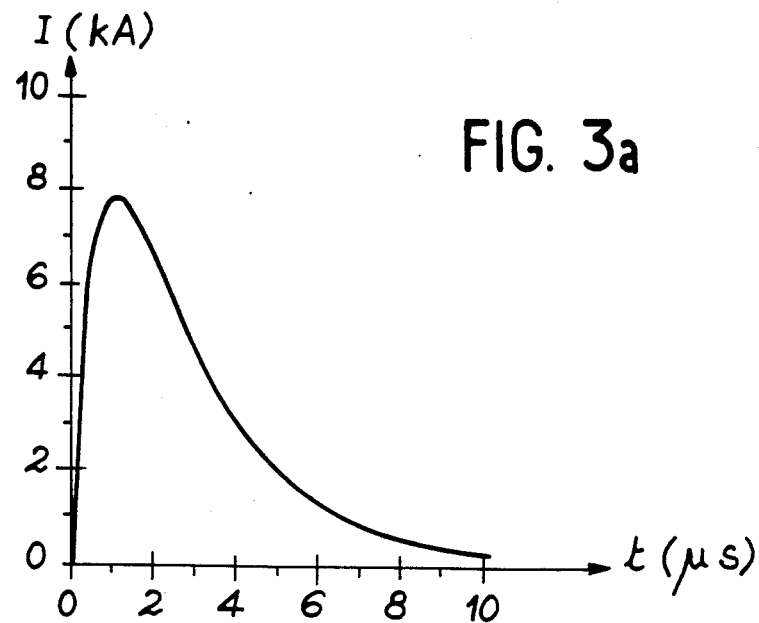
FIGS. 3a and 3b, respectively, the shape of a current pulse supplied by a module of the generator according to the invention and the shape of a typical signal supplied by a protective system receiving said current pulse.
Figure 3B:
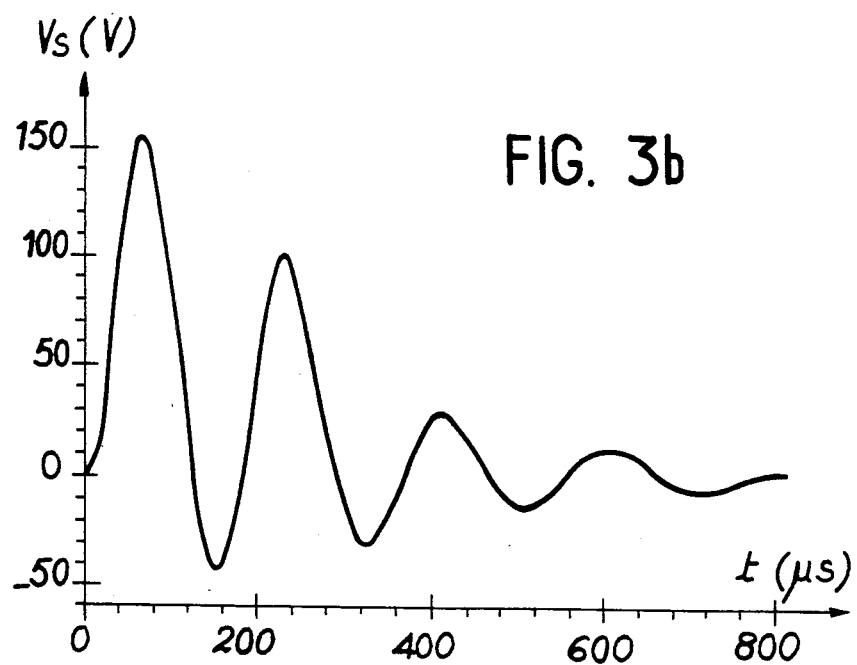

FIG. 3a shows the current pulse supplied by each module of the generator according to the invention and FIG. 3b shows the output voltage of the protective system filter. The current pulse is produced by the discharge of a 3 $\mu$F capacitor on a 1 ohm resistance. The charging voltage of the capacitor supplied by the voltage source is 10 kV.

The parasitic inductance due to the connection line between the generator and the protective system, whereby said connection need only be a few centimeters due to the small overall dimensions of the module, added to the inherent inductance of the generator, limits the intensity of the current pulse supplied to 8 kV.

The function of the clipper of the protective system is to divert most of the current and/or energy to earth and to bring the voltage level of the pulse to a minimum value. The low-pass filter located downstream of said clipper makes it possible not only to divert a fraction of the current and/or energy not diverted during clipping, but also to attenuate the voltage level of the pulse following clipping, particularly in the high frequency part of the pulse spectrum.

FIG. 3b illustrates the typical voltage signal supplied by the protective system. This voltage has an attenuated sinusoidal shape with a pseudo-period of approximately 220 $\mu$s. The first two peaks have the respective intensities of approximately 150 V and 100 V.

What is claimed is:

1. A current pulse generator for generating strong synchronous current pulses on parallel outputs comprising:
 a high voltage stage having a power supply unit, a first high voltage source and a second high voltage source,
 a group of N identical modules, in which N is an integer, each module being provided with an input terminal, a control terminal and an output terminal, each module comprising a load resistor and a spark gap connected in series between the intput terminal and the output terminal, a storage capacitor having an input connected to the common point between said load resistor and said spark gap, and a transformer connected to the control terminal and controlling said spark gap,
 coaxial connections for connecting outputs of said first high voltage source to the input terminals of said modules,
 triggering control means having a triggering device and a control circuit, said triggering device having an input terminal connected to said second high voltage source, N parallel output terminals and a control input, and comprising two spark gaps in cascade connected between the input terminal and the N parallel output terminals, said control circuit being connected to the control input of said triggering device, and
 coaxial connections for connecting the output terminals of said triggering device to the input terminals of different ones of said modules.

* * * * *